(12) United States Patent
Hanaoka

(10) Patent No.: US 6,895,029 B2
(45) Date of Patent: May 17, 2005

(54) NITRIDE SEMICONDUCTOR LASER DEVICE

(75) Inventor: Daisuke Hanaoka, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/255,062

(22) Filed: Sep. 26, 2002

(65) Prior Publication Data

US 2003/0067950 A1 Apr. 10, 2003

(30) Foreign Application Priority Data

Sep. 27, 2001 (JP) ........................................ 2001-295939

(51) Int. Cl.⁷ ................................................. H01S 5/00
(52) U.S. Cl. ............................. 372/45; 372/43; 372/46; 372/48; 372/65
(58) Field of Search ............................. 372/45, 46, 48, 372/65

(56) References Cited

U.S. PATENT DOCUMENTS

| | | | | |
|---|---|---|---|---|
| 5,247,203 | A | * | 9/1993 | Shigihara et al. ............ 257/713 |
| 5,519,720 | A | * | 5/1996 | Hirano et al. ................. 372/36 |
| 5,783,818 | A | * | 7/1998 | Manabe et al. ............. 250/239 |
| 5,794,839 | A | * | 8/1998 | Kimura et al. ........... 228/123.1 |
| 6,268,230 | B1 | * | 7/2001 | Kuniyasu ..................... 438/46 |
| 6,410,904 | B1 | * | 6/2002 | Ito et al. ................. 250/214 R |
| 2001/0002917 | A1 | * | 6/2001 | Ozawa ........................ 372/43 |
| 2002/0100914 | A1 | * | 8/2002 | Yoshida ....................... 257/98 |
| 2002/0121863 | A1 | * | 9/2002 | Morishita ................ 315/169.3 |

FOREIGN PATENT DOCUMENTS

JP 11-340571 12/1999

* cited by examiner

Primary Examiner—Minsun Oh Harvey
Assistant Examiner—Dung Nguyen
(74) Attorney, Agent, or Firm—Morrison & Foerster LLP (57) ABSTRACT

A nitride semiconductor laser chip 103 is fixed to a submount 102 serving as a mount member with solder 107. The submount 102 is made of a material having a thermal expansion coefficient higher than that of a nitride semiconductor substrate, and has a thickness equal to or greater than 1.2 times the thickness of the layered nitride semiconductor structure composed of an n-type GaN substrate 1 and a layered nitride semiconductor portion 2. Between the n-type GaN substrate 1 and the submount 102 is laid a metal film having a thickness of from 1 to 50 µm.

41 Claims, 7 Drawing Sheets

NITRIDE SEMICONDUCTOR LASER DEVICE

BACKGROUND OF THE INVENTION

1. Field of the Invention

The present invention relates to a nitride semiconductor laser device having a nitride semiconductor laser chip mounted on a mount member. In the present specification, a nitride semiconductor denotes a compound of the composition $Al_xGa_yIn_zN$ ($0 \leq x \leq 1$, $0 \leq y \leq 1$, $0 \leq z \leq 1$, $x+y+z=1$). Here, of the nitrogen atoms contained in this nitride semiconductor, about 10% or less (which must have a hexagonal crystal structure) may be replaced with any of the elements As, P, and Sb. Moreover, the nitride semiconductor may be doped with Si, O, Cl, S, C, Ge, Zn, Cd, Mg, or Be.

2. Description of the Prior Art

Semiconductor laser devices produce intense light with high monochromaticity, and thus the laser light they emit can be condensed to an extremely small spot. For these advantages, semiconductor laser devices are used, for example, as light sources in optical pickup parts for use in drives for recording media such as optical and magneto-optical discs with which the recording and reading of data are achieved by irradiating them with light. In particular, nitride-based semiconductor laser devices, which produce light of short wavelengths with high output, are eagerly developed as optical pickup devices to supplant red semiconductor laser devices for application in drives for high-density recording media such as DVDs.

Figure 10:
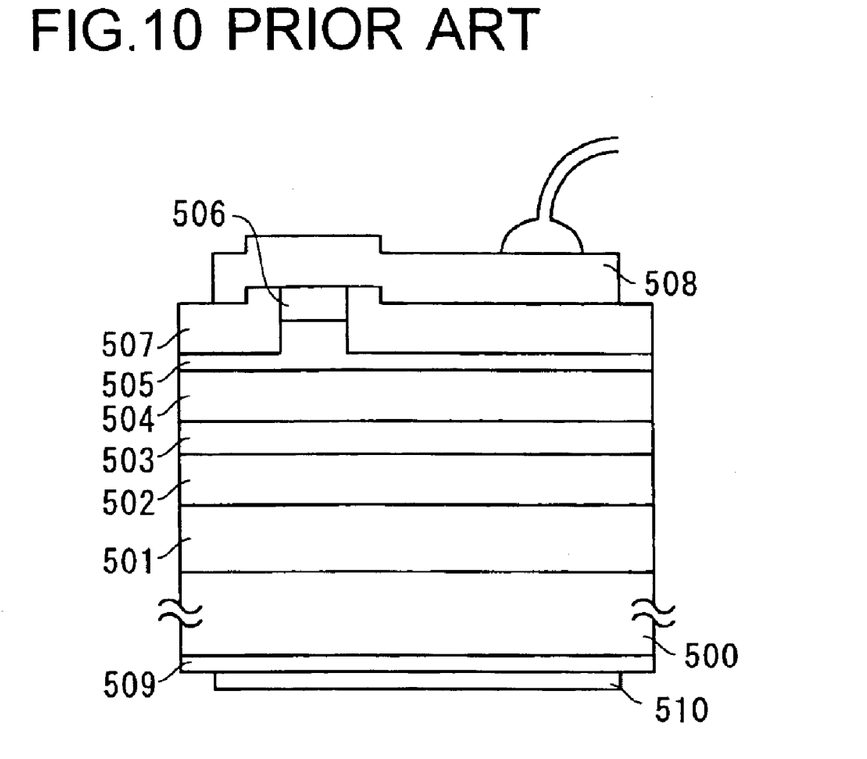
FIG. 10 is a sectional view showing the structure of a nitride semiconductor laser chip.

An example of a nitride semiconductor laser chip for use in such nitride semiconductor laser devices is proposed in Japanese Patent Application Laid-Open No. H11-340571. FIG. 10 shows the structure of the nitride semiconductor laser chip disclosed in this publication. The nitride semiconductor laser chip shown in FIG. 10 has, on the top surface of a nitride semiconductor substrate 500, an n-type clad layer 501, an n-type optical guide layer 502, an active layer 503, a p-type optical guide layer 504, a p-type clad layer 505, a p-type contact layer 506, an insulating film 507, and a p-electrode 508 laid in this order, and has, on the bottom surface of the nitride semiconductor substrate 500, an n-type contact layer 509 and an n-electrode 510 laid in this order.

Figure 3:
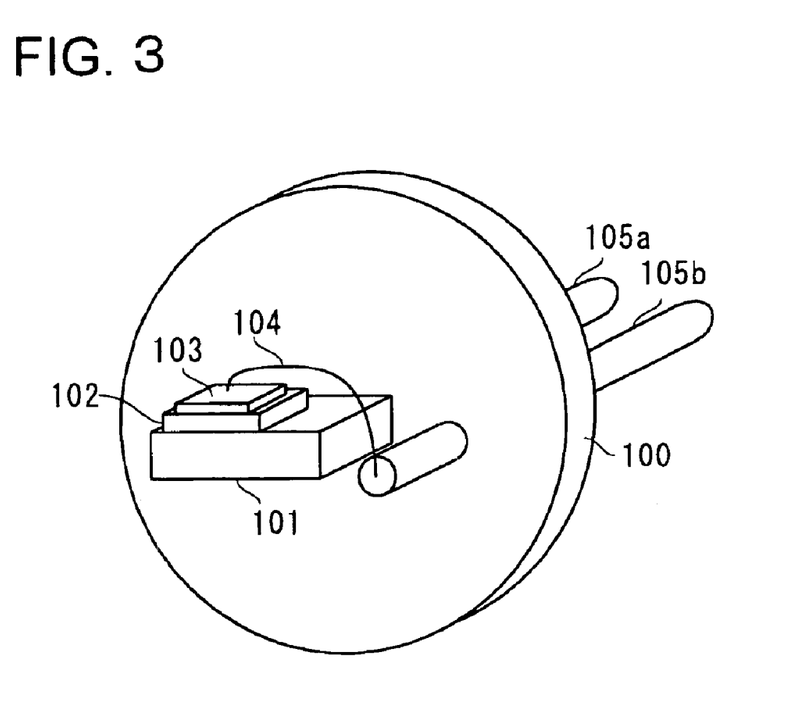
FIG. 3 is a perspective view showing an example of the structure of a nitride semiconductor laser device.

The nitride semiconductor laser chip structured as shown in FIG. 10 is mounted on a stem to produce a nitride semiconductor laser device. Specifically, as shown in FIG. 3, the nitride semiconductor laser chip 103 is mounted on a mount member 102 placed on a chip mount portion 101 formed on the stem 100. Here, the nitride semiconductor laser chip 103 is mounted so that its n-electrode 510 is kept in contact with the mount member 102. Moreover, to fix the nitride semiconductor laser chip 103 on the mount member 102, the mount surface of the mount member 102 is metalized with Au, and the n-electrode 510 is bonded to it by thermal compression. On the other hand, the p-electrode 508 is electrically connected to a pin 105b by a wire 104 of Au. Another pin 105a is electrically connected to the chip mount portion 101 and to the mount member 102. The pins 105a and 105b are electrically insulated from the stem 100.

In the nitride semiconductor laser device structured as described above, when voltages of different potentials are applied to the pins 105a and 105b, and thus to the n-electrode 510 and the p-electrode 508 of the nitride semiconductor laser chip 103, the nitride semiconductor laser chip 103 starts laser operation.

In GaAs-based semiconductor laser devices conventionally used, the mount member (corresponding to the mount member 102 shown in FIG. 3) on which a semiconductor laser chip is mounted is made of a material (for example, SiC) that has high thermal conductivity and that has a thermal expansion coefficient as close as possible to that of GaAs used as the substrate of the semiconductor laser chip. This is because, in GaAs-based semiconductor laser devices, if the mount member is made of a material of which the thermal expansion coefficient greatly differs from that of GaAs used in the semiconductor laser chip, when the semiconductor laser chip is soldered to the mount member, high stress occurs in the semiconductor laser chip, causing defects in and shortening the laser operating lifetime of the semiconductor laser devices.

On the other hand, nitride semiconductor laser devices produced by conventional techniques have short laser operating lives. They have short laser operating lives even when their mount member, shown in FIG. 3, is made of SiC as in GaAs-based semiconductor laser devices.

SUMMARY OF THE INVENTION

An object of the present invention is to provide a nitride semiconductor laser device with an long laser operating lifetime.

To achieve the above object, according to the present invention, a nitride semiconductor laser device is provided with: a nitride semiconductor laser chip, which is composed of a nitride semiconductor substrate and a layered nitride semiconductor portion having a plurality of nitride semiconductor layers laid on a surface of the nitride semiconductor substrate, and a mount member, to which the nitride semiconductor laser chip is fixed, and which is made of a material having a thermal expansion coefficient higher than the thermal expansion coefficient of the nitride semiconductor substrate and has a thickness equal to or greater than 1.2 times the thickness of the layered nitride semiconductor structure composed of the nitride semiconductor substrate and the layered nitride semiconductor portion.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
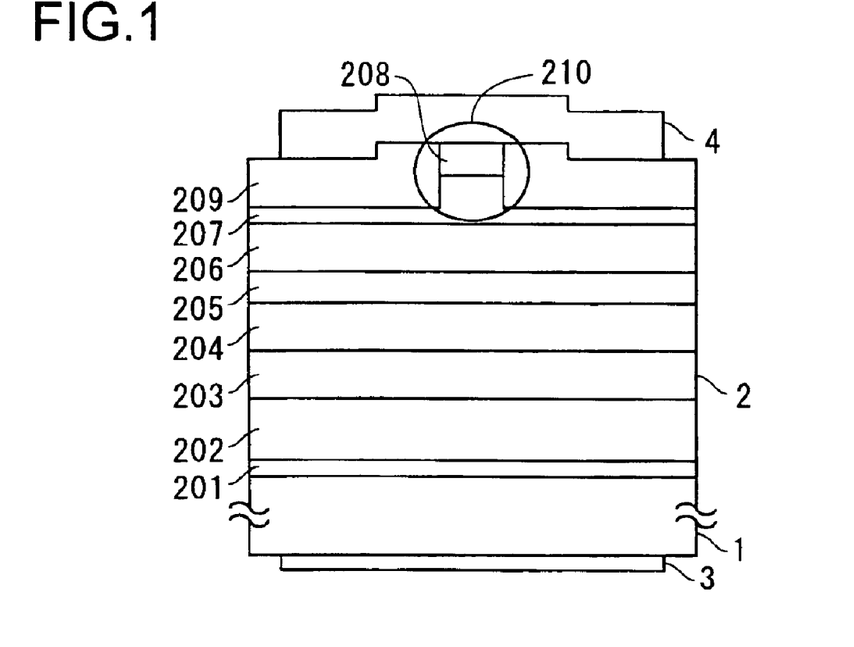
FIG. 1 is a sectional view showing the structure of a nitride semiconductor laser chip.

Hereinafter, embodiments of the present invention will be described with reference to the drawings. FIG. 1 is a sectional view showing the structure of a nitride semiconductor laser chip employed in a nitride semiconductor laser device according to the invention. First, the structure of the nitride semiconductor laser chip shown in FIG. 1 will be described.

The nitride semiconductor laser chip shown in FIG. 1 has, on the top surface of an n-type GaN substrate 1, an n-type AlGaInN buffer layer 201, an n-type AlGaInN contact layer 202, an n-type AlGaInN clad layer 203, an n-type AlGaInN guide layer 204, an n-type AlGaInN multiple quantum well active layer 205, a p-type AlGaInN guide layer 206, a p-type AlGaInN clad layer 207, and a p-type AlGaInN contact layer 208 laid in this order. Moreover, an insulating film 209 is laid on the surface of the p-type AlGaInN clad layer 207, along both sides of a ridge portion 210 formed by the p-type AlGaInN clad layer 207 and the p-type AlGaInN contact layer 208.

This nitride semiconductor laser chip has an n-electrode 3 formed on the bottom surface of the n-type GaN substrate 1, and has a p-electrode 4 formed on the surfaces of the p-type AlGaInN contact layer 208 and the insulating film 209. The ridge portion 210 has the shape of a stripe extending in the direction in which a cavity is formed, and thus the nitride semiconductor laser chip shown in FIG. 1 has a ridge-stripe-type structure.

In this nitride semiconductor laser chip, first, the n-type GaN substrate 1 is cleaned with acetone and ethanol. Then, the n-type GaN substrate 1 is transported into an apparatus for MOCVD (metal organic chemical vapor deposition), where, on its top surface, the n-type AlGaInN buffer layer 201, n-type AlGaInN contact layer 202, n-type AlGaInN clad layer 203, n-type AlGaInN guide layer 204, n-type AlGaInN multiple quantum well active layer 205, p-type AlGaInN guide layer 206, p-type AlGaInN clad layer 207, and p-type AlGaInN contact layer 208 are laid in this order at appropriate substrate temperatures and with adequate amounts of material gasses and carrier gasses introduced for the individual layers.

Here, the n-type AlGaInN clad layer 203 is so formed as to have a lower refractive index and a greater band gap than the n-type AlGaInN guide layer 204. Moreover, the p-type AlGaInN clad layer 207 is so formed as to have a lower refractive index and a greater band gap than the p-type AlGaInN guide layer 206. The n-type AlGaInN multiple quantum well active layer 205 is composed of a plurality of barrier layers and a plurality of well layers formed alternately.

Then, etching is performed to remove portions of the top two layers in the shape of stripes along the direction of the cavity and thereby form the ridge portion 210. Then, the insulating film 209, such as of $SiO_2$, is formed on top by vacuum evaporation, and thereafter the p-type AlGaInN contact layer 208 is exposed. In the layered structure thus obtained, the portion composed of the n-type AlGaInN buffer layer 201, n-type AlGaInN contact layer 202, n-type AlGaInN clad layer 203, n-type AlGaInN guide layer 204, n-type AlGaInN multiple quantum well active layer 205, p-type AlGaInN guide layer 206, p-type AlGaInN clad layer 207, p-type AlGaInN contact layer 208, and insulating film 209 will be called the layered nitride semiconductor portion 2.

With the layered nitride semiconductor portion 2 formed on the top surface of the n-type GaN substrate 1, the n-type GaN substrate 1 has a thickness of 350 $\mu$m, and the layered nitride semiconductor portion 2 has a thickness of 10 $\mu$m. Then, layers of Pd, Mo, and Au are laid further on top in this order by vacuum evaporation to form the p-electrode 4. In the p-electrode 4, the layers of Pd, Mo, and Au have thicknesses of 150 Å, 150 Å, and 2,000 Å, respectively.

Next, by a physical method such as grinding or polishing, or by a chemical method such as wet etching or dry etching, the thickness of the n-type GaN substrate 1 is reduced so that the wafer composed of the n-type GaN substrate 1, layered nitride semiconductor portion 2, and p-electrode 4 has a thickness of from 40 to 250 $\mu$m. In this way, the thickness of the wafer is adjusted so as to permit easy dicing of the wafer. Here, in particular in a case where cleavage surfaces are to be formed as mirror surfaces, it is advisable to adjust the thickness of the wafer on the thin side, such as from 40 to 200 $\mu$m. For example, when used in a first embodiment, which will be described later, the thickness of the wafer was first adjusted to 180 $\mu$m using a grinding machine, and was then adjusted to 150 $\mu$m using the polishing machine.

Next, on the bottom surface of the n-type GaN substrate 1, layers of Ti, Al, Mo, Pt, and Au are laid in this order by vacuum deposition, ion plating, or sputtering to form the n-electrode 3. In the n-electrode 3, the layers of Ti, Al, Mo, Pt, and Au have thicknesses of 300 Å, 1,500 Å, 80 Å, 150 Å, and 1,500 Å, respectively. The layers of Ti and Al are layers that achieve ohmic contact with the n-type GaN substrate 1. The layer of Mo is a blocking layer that prevents the alloying between Au and Al. The layer of Pt is a layer that prevents excessive reaction between solder and the portion of the n-electrode 3 with which the solder makes contact. The layer of Au is a layer that, when the nitride semiconductor laser chip is mounted on a mount member, mixes with solder and thereby permits the nitride semiconductor laser chip to be fixed firmly.

The n-type GaN substrate 1, having the layered nitride semiconductor portion 2, n-electrode 3, and p-electrode 4 formed on it in this way, is then cleaved in the direction perpendicular to the direction of the cavity. Specifically, the wafer, composed of the n-type GaN substrate 1, layered nitride semiconductor portion 2, n-electrode 3, and p-electrode 4, is fixed, with the n-electrode 3 up, on an apparatus provided with a diamond needle for forming grooves such as a dicer, and then, by scribing with the diamond needle, scribe lines are drawn on the wafer.

Then, by applying force to the wafer using a breaking blade or the like, the wafer is cleaved along the scribe lines. Thereafter, in a similar manner, the wafer is further cleaved in the direction parallel to the direction of the cavity with force applied using a breaking blade or the like. In this way, a nitride semiconductor laser device as shown in FIG. 1 is obtained. The wafer may be diced by any other method than by scribing as described above. For example, the wafer may be diced by dicing relying on scratching or cutting using a wire saw or sheet blade, or by laser scribing whereby scribe lines are formed as cracks produced as a result of targeted portions of the wafer being heated by irradiation of a laser beam such as an excimer laser beam and then quickly cooled, or by laser abrasion whereby grooves are formed as a result of targeted portions of the wafer being evaporated by irradiation of a laser beam with a high energy density.

The first and second embodiments described below deal with nitride semiconductor laser devices employing nitride semiconductor laser chips structured as described above.

First Embodiment

Figure 2:
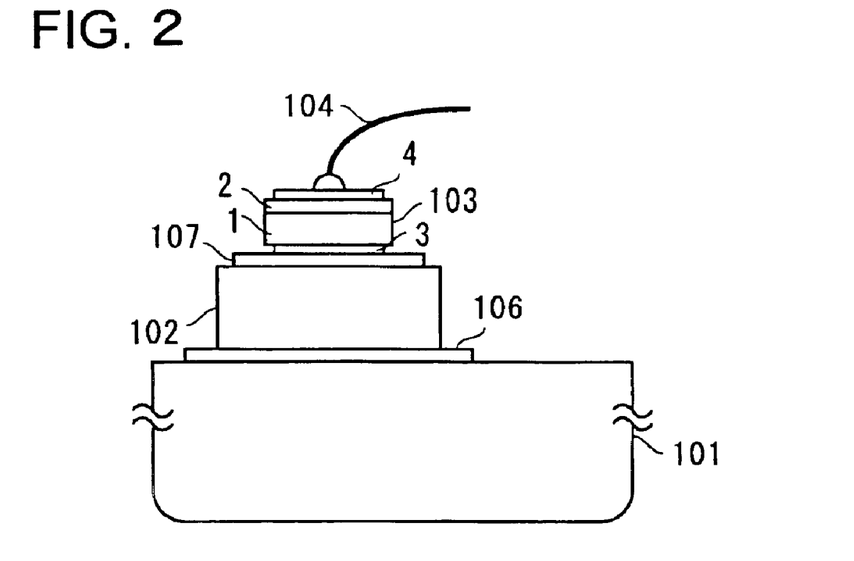
FIG. 2 is a sectional view showing the structure of the nitride semiconductor laser device of a first embodiment of the invention.

A first embodiment of the invention will be described below with reference to the drawings. FIG. 2 is a sectional view showing how a nitride semiconductor laser chip is mounted in the nitride semiconductor laser device of this embodiment. Here, the nitride semiconductor laser chip is mounted as shown in FIG. 3 to produce the nitride semiconductor laser device. In this embodiment, a "submount" serves as a mount member.

In the nitride semiconductor laser device of this embodiment, as shown in FIG. 2, the nitride semiconductor laser chip 103 is fixed, with solder 107, on the surface of a submount 102 that is fixed, with solder 106, on the surface of a chip mount portion 101 formed so as to protrude from a stem 100 shown in FIG. 3. That is, the submount 102 is, through the solder 106, electrically connected to and fixed on the surface of the chip mount portion 101, which is, as shown in FIG. 3, electrically connected to a pin 105a.

First, the nitride semiconductor laser chip 103 is mounted on the surface of the submount 102. Specifically, the solder 107 is applied on the surface of the submount 102, and then the solder 107 is heated to a temperature slightly higher than its melting point so as to be melted. Then, the nitride semiconductor laser chip 103 is placed on it with the n-electrode 3 of the nitride semiconductor laser chip 103 facing the submount 102. Then, with the temperature maintained for about one minute, an adequate load is applied so that a satisfactory joint is achieved between the n-electrode 3 and the solder 107. This permits the topmost Au layer of the n-electrode 3 to dissolve into and alloy with the solder 107. Alternatively, it is also possible to apply the solder 107 to the nitride semiconductor laser chip 103 and then mount it on the submount 102.

Subsequently, the submount 102 having the nitride semiconductor laser chip 103 bonded and fixed to its surface with the solder 107 is bonded and fixed, with the solder 106, on the surface of the chip mount portion 101. Then, a wire 104 connected to a pin 105b as shown in FIG. 3 is connected to the p-electrode 4 of the nitride semiconductor laser chip 103, so that the pin 105b is electrically connected to the p-electrode 4 of the nitride semiconductor laser chip 103. After the nitride semiconductor laser chip 103 is mounted on the stem 100 in this way, the stem 100 is covered with an unillustrated cap with nitrogen gas sealed in.

In the nitride semiconductor laser device of this embodiment structured as described above, the solder 106 is made of AgCuSn, and the solder 107 is made of AuSn. The submount 102 is made of Cu, which has a thermal expansion coefficient higher than that of the n-type GaN substrate 1, and both the top and bottom surfaces of the submount 102 are plated with Ni and Au in this order to form layers of Ni and Au having thicknesses of 0.4 $\mu$m and 0.1 $\mu$m, respectively. When the nitride semiconductor laser chip 103 is mounted on the submount 102, the solder 107 is melted at about 350° C.

Figure 4:
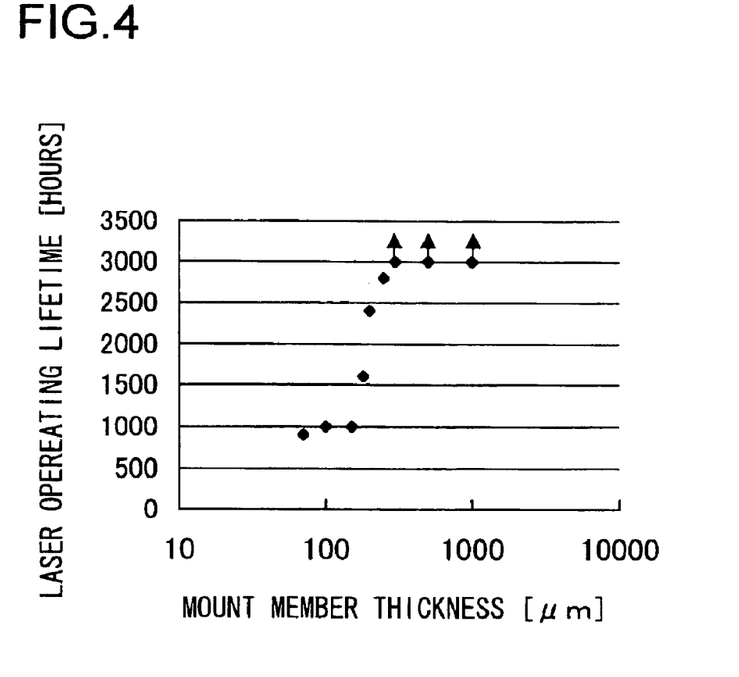
FIG. 4 is a graph showing how the laser operating lifetime varies according to the thickness of the mount member in a nitride semiconductor laser device according to the invention.

In this nitride semiconductor laser device structured as described above, when the metal layer, including the solder 107, between the n-type GaN substrate 1 and the submount 102 has a thickness of 10 $\mu$m, as the thickness of the submount 102 is varied from 70 $\mu$m to 1 mm, the laser operating lifetime varies as shown in FIG. 4. Here, as described above, the layered nitride semiconductor structure, composed of the n-type GaN substrate 1 and the layered nitride semiconductor portion 2 of the nitride semiconductor laser chip 103, has a thickness of 150 $\mu$m. It is to be noted that, in FIG. 4, the horizontal axis is graduated logarithmically. Here, the laser operating lifetime denotes the duration for which the nitride semiconductor laser chip can operate on an APC (automatic power control) basis at an optical output of 30 mW. On the other hand, the mount member denotes the member on which the nitride semiconductor laser chip is mounted. Specifically, when the nitride semiconductor laser chip is mounted on the submount, the submount serves as the mount member; when the nitride semiconductor laser chip is mounted on the chip mount portion of the stem, the chip mount portion serves as the mount member.

The graph of FIG. 4 clearly shows that, when the thickness of the submount 102 serving as a mount member is equal to or greater than 180 $\mu$m, i.e. 1.2 times the thickness of the layered nitride semiconductor structure, the laser operating lifetime is 1,600 hours or longer, i.e., satisfactorily long. As the submount 102 is made thicker, the laser operating lifetime becomes longer until eventually, when its thickness is equal to or greater than 300, i.e., twice the thickness of the layered nitride semiconductor structure, the laser operating lifetime is over 3,000 hours.

Similar results are obtained in experiments in which the thickness of the layered nitride semiconductor structure is varied from 50 to 350 $\mu$m. That is, by making the thickness of the submount 102 equal to or greater than 1.2 times the thickness of the layered nitride semiconductor structure, it is possible to obtain a satisfactorily long laser operating lifetime, and, by making the thickness of the former equal to or greater than twice the thickness of the latter, it is possible to obtain a still longer laser operating lifetime.

Figure 11:
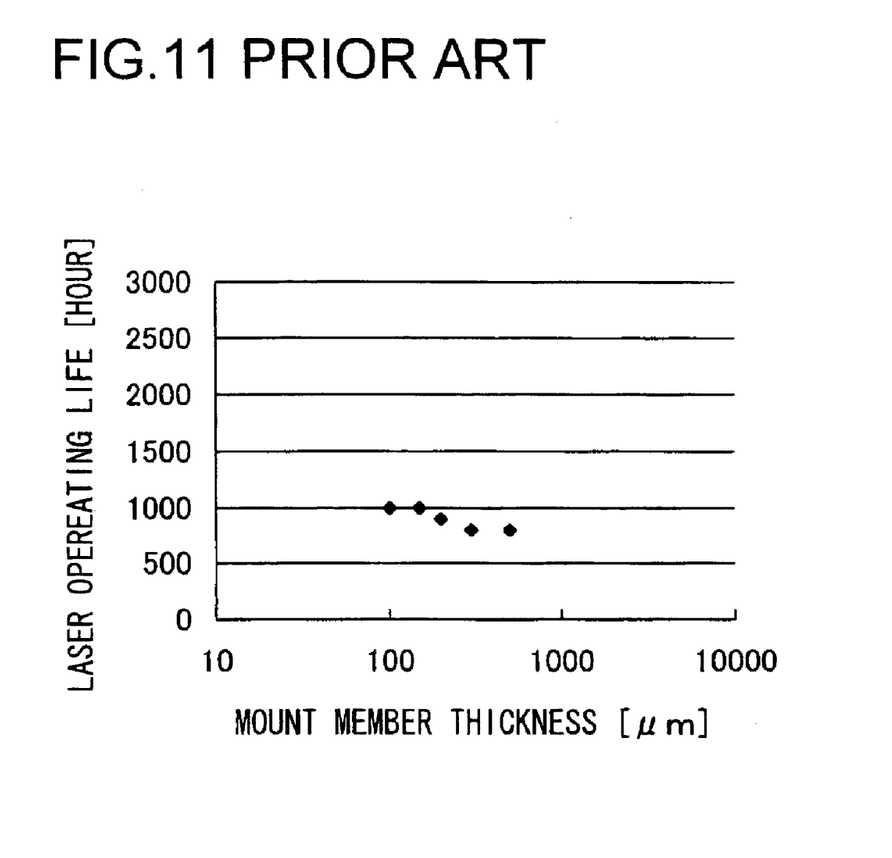
FIG. 11 is a graph showing how the laser operating lifetime varies according to the thickness of the mount member in a conventional nitride semiconductor laser device.

One of the reasons that increasing the thickness of the submount 102 serving as a mount member extends the laser operating lifetime is that the submount 102 is made of Cu, which has a thermal expansion coefficient higher than that of GaN used in the nitride semiconductor substrate (in this embodiment, the n-type GaN substrate 1), which is the main component of the layered nitride semiconductor structure. Specifically, similar experiments conducted with comparative examples employing a mount member made of SiC, which has a thermal expansion coefficient lower than that of GaN, yield results as shown in FIG. 11, i.e., short laser operating lives on the whole. The thermal expansion coefficients of various materials are shown in Table 1.

As shown in Table 1, Cu has a thermal expansion coefficient of $17 \times 10^{-6}$ [1/K], which is higher than the thermal expansion coefficient of GaN, i.e., $5.6 \times 10^{-6}$ [1/K]. On the other hand, SiC has a thermal expansion coefficient of $3.7 \times 10^{-6}$ [1/K], which is lower than the thermal expansion coefficient of GaN.

When the submount 102 is made of a material having a thermal expansion coefficient higher than that of GaN in this way, the nitride semiconductor laser chip 103, after it is mounted on the submount 102, is subject to compressive stress. Under compressive stress, i.e., after the mounting, the nitride semiconductor laser chip 103 exhibits a lower threshold current of laser operation than before the mounting. This is considered to contribute to the extension of the laser operating lifetime. It is to be noted that, when the thickness of the submount 102 serving as a mount member is smaller than 1.2 times the thickness of the layered nitride semiconductor structure, after the nitride semiconductor laser chip 103 is mounted on the submount 102, the submount 102 deforms and thereby absorbs the stress, producing no effect of extending the laser operating lifetime.

In this embodiment, the submount 102 is made of Cu. However, the submount 102 may be made of any other material that has a thermal expansion coefficient higher than that of GaN, for example, from among the materials listed in Table 1, GaAs, Cu—W (for example, CuW10, CuW15, or CuW20), $Al_2O_3$, BeO, Al—SiC, Fe, Au, Ag, or Al. Among these, those having higher thermal conductivity are preferred for their higher heat dissipation. The submount 102 may have a thin film of Au or the like formed on its surface. When the submount 102 is made of a material with low electrical conductivity, it is advisable to achieve electrical contact by connecting the surface of the submount 102 on which the nitride semiconductor laser chip 103 is mounted to the chip mount portion 101 by a wire.

Figure 5:
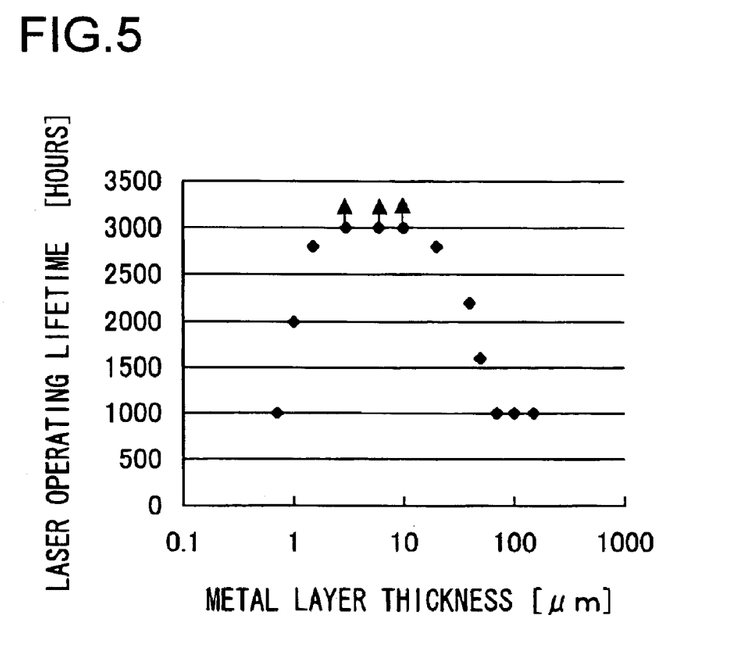
FIG. 5 is a graph showing how the laser operating lifetime varies according to the thickness of the metal layer laid between the nitride semiconductor laser chip and the mount member.

With the submount 102 made of Cu, which has a thermal expansion coefficient higher than that of GaN, in this way, when the layered nitride semiconductor structure, composed of the n-type GaN substrate 1 and the layered nitride semiconductor portion 2 of the nitride semiconductor laser chip 103, and the submount 102 have thicknesses of 150 μm and 300 μm, respectively, as the thickness of the metal layer, including the solder 107, between the n-type GaN substrate 1 and the submount 102 is varied from 0.7 μm to 150 μm, the laser operating lifetime varies as shown in FIG. 5.

Here, if the metal layer is thin, specifically a few tens of μm or less, on the bonding surface of the submount 102 or the nitride semiconductor laser chip 103, a layer of AuSn solder is formed by vacuum evaporation or sputtering. On the other hand, if the metal layer is thick, specifically a few tens of μm or more, the nitride semiconductor laser chip 103 is mounted on the submount 102 with foil of AuSn interposed in between. It is to be noted that, in FIG. 5, the horizontal axis is graduated logarithmically.

FIG. 5 clearly shows that, when the metal layer, including the solder 107, between the n-type GaN substrate 1 and the submount 102 has a thickness of from 1 to 50 μm, the laser operating lifetime is 1,600 hours or longer, i.e., satisfactorily long. In particular, when the metal layer has a thickness of from 3 to 10 μm, the laser operating lifetime is over 3,000 hours. Similar results are obtained when the thickness of the submount 102 is made equal to or greater than 1.2 times the thickness of the layered nitride semiconductor structure.

The reasons for these results are considered to be that, with the metal layer thicker than 50 μm, when the nitride semiconductor laser chip 103 is mounted on the submount 102, the compressive stress acting on the nitride semiconductor laser chip 103 is absorbed by the metal layer, including the solder 107, between the nitride semiconductor laser chip 103 and the submount 102, and that, with the metal layer thinner than 1 μm, the submount 102 and the nitride semiconductor laser chip 103 do not stick to each other sufficiently firmly, leading to poor heat dissipation. For these reasons, if the metal layer, including the solder 107, between the n-type GaN substrate 1 and the submount 102 is thinner than 1 μm or thicker than 50 μm, the laser operating lifetime is short.

In this embodiment, the nitride semiconductor laser chip 103 is bonded to the submount 102 with the solder 107 made of AuSn. However, it is also possible to use instead solder made of, for example, In, Sn, Pb, InAl, AgSn, AgCuSn, ZnSn, PbIn, PbSn, InSn, AuSi, or AuGe, or a compound containing any of these. It is preferable that the solder 107 be made of a material having a high melting point and offering high bonding strength, and therefore preferred materials are AgSn, AgCuSn, AuSi, AuGe, PbSn, InSn, and the like.

In this embodiment, the surface of the submount 102 is plated with Ni and Au in this order to form layers of Ni and Au having thicknesses of 0.4 μm and 0.1 μm, respectively. However, so long as the desired properties are obtained in terms of the bonding between the submount 102 and the nitride semiconductor laser chip 103 with the solder 107, any other structure may be formed using any other materials on the surface of the submount 102.

In this embodiment, the submount 102 is fixed on the chip mount portion 101 with the solder 106 made of AgCuSn. However, it is also possible to use instead solder made of any other material, for example, PbSn, AgSn, ZnSn In, or Pb. It is to be noted, however, that, in this embodiment, since the submount 102 is fixed to the chip mount portion 101 after the nitride semiconductor laser chip 103 is mounted on the submount 102, it is preferable that the solder 106 be made of a material having a lower melting point than the solder 107 used to fix the nitride semiconductor laser chip 103 to the submount 102.

In this embodiment, a submount is used as a mount member. Since the surface of a submount can be finished with higher flatness than that of a chip mount portion, using a submount permits a nitride semiconductor laser chip and a mount member to stick to each other more firmly and securely. This helps realize a nitride semiconductor laser device with satisfactory characteristics.

Second Embodiment

Figure 6:
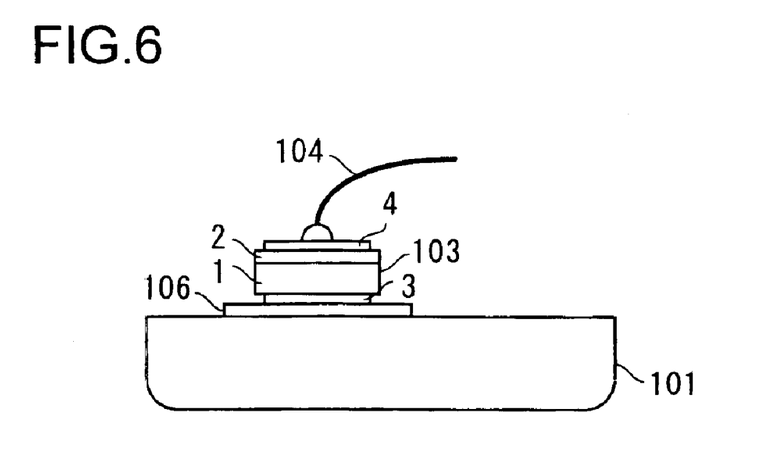
FIG. 6 is a sectional view showing the structure of the nitride semiconductor laser device of a second embodiment of the invention.
Figure 7:
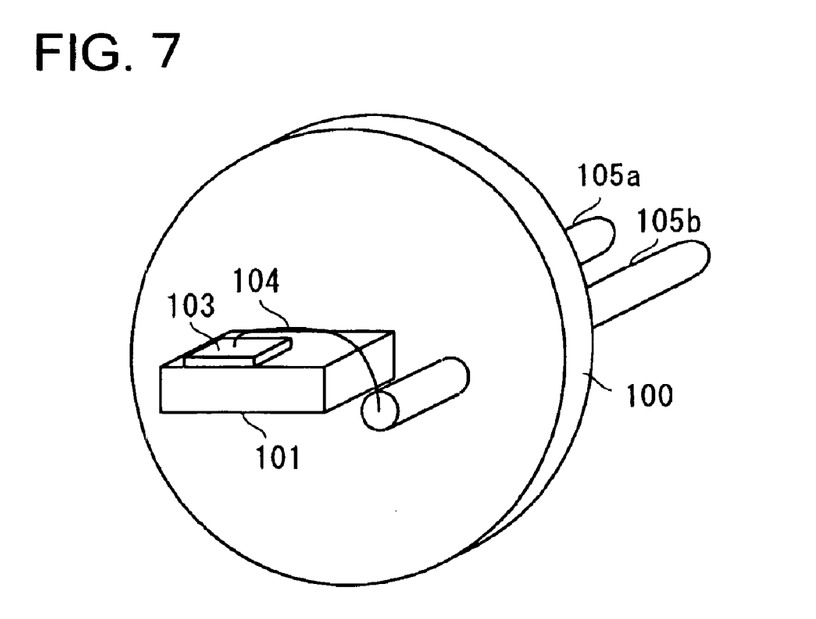
FIG. 7 is a perspective view showing an example of the structure of a nitride semiconductor laser device.

A second embodiment of the invention will be described below with reference to the drawings. FIG. 6 is a sectional view showing how a nitride semiconductor laser chip is mounted in the nitride semiconductor laser device of this embodiment. Here, the nitride semiconductor laser chip is mounted as shown in FIG. 7 to produce the nitride semiconductor laser device. In this embodiment, a "chip mount portion" serves as a mount member. It is to be noted that, in FIGS. 6 and 7, such components as find their counterparts in FIGS. 2 and 3, respectively, are identified with the same reference numerals, and their detailed explanations will be omitted.

As shown in FIGS. 6 and 7, in the nitride semiconductor laser device of this embodiment, the nitride semiconductor laser chip 103 is fixed, with solder 106, on the surface of a chip mount portion 101 formed so as to protrude from a stem 100. In other respects, the structure here is the same as in the first embodiment, and therefore no further explanations will be given with respect to the structure.

In the nitride semiconductor laser device structured as described above, the thickness of the chip mount portion 101 is made equal to or greater than 1.2 times (further preferably, 2 times) the thickness of the layered nitride semiconductor structure, composed of the n-type GaN substrate 1 and the layered nitride semiconductor portion 2 of the nitride semiconductor laser chip 103. Moreover, the chip mount portion 101 is made of a material having a thermal expansion coefficient higher than that of GaN. Furthermore, the metal layer, including the solder 106, between the n-type GaN substrate 1 and the chip mount portion 101 is given a thickness of from 1 to 50 μm. In this way, when the nitride semiconductor laser chip 103 is mounted on the chip mount portion 101, the nitride semiconductor laser chip 103 is subjected to compressive stress, and this extends the laser operating lifetime.

In this embodiment, the layered nitride semiconductor structure of the nitride semiconductor laser chip 103 has a thickness of 200 µm, the solder 106 is made of AgCuSn, and the metal layer, including the solder 106, between the n-type GaN substrate 1 and the chip mount portion 101 has a thickness of 20 µm. The chip mount portion 101 is made of Cu, and its surface is plated with Mo and Au in this order by vacuum evaporation to form layers of Mo and Au having thicknesses of 0.4 µm and 0.03 µm, respectively. The chip mount portion 101 has a thickness of 1,000 µm. The chip mount portion 101 is fixed to the stem 100 by being welded to it. With the nitride semiconductor laser device structured as described above, the laser operating lifetime is over 3,000 hours.

In this embodiment, the nitride semiconductor laser chip 103 is bonded to the chip mount portion 101 with the solder 106 made of AuCuSn. However, it is also possible to use instead solder made of, for example, In, Sn, Pb, InAl, AgSn, AuSn, ZnSn, PbIn, PbSn, InSn, AuSi, or AuGe, or a compound containing any of these. It is preferable that the solder 106 be made of a material having a high melting point and offering high bonding strength, and therefore preferred materials are AuSn, AgSn, AuSi, AuGe, PbSn, InSn, and the like.

In this embodiment, the surface of the chip mount portion 101 is plated with Mo and Au in this order to form layers of Mo and Au having thicknesses of 0.4 µm and 0.03 µm, respectively. However, so long as the desired properties are obtained in terms of the bonding between the chip mount portion 101 and the nitride semiconductor laser chip 103 with the solder 106, any other structure may be formed using any other materials on the surface of the chip mount portion 101.

In this embodiment, as in the first embodiment, the chip mount portion 101 may be made of any other material than Cu so long as it has a thermal expansion coefficient higher than that of GaN, for example, from among the materials listed in Table 1, GaAs, Cu—W (for example, CuW10, CuW15, or CuW20), Al$_2$O$_3$, BeO, Al—SiC, Fe, Au, Ag, or Al. Among these, those having higher thermal conductivity are preferred for their higher heat dissipation. The chip mount portion 101 may have a thin film of Au or the like formed on its surface. When the chip mount portion 101 is made of a material with low electrical conductivity, it is advisable to achieve electrical contact by forming a metal layer on its surface, and, where necessary, by the use of a wire as well.

In this embodiment, a chip mount portion is used as a mount member. This makes it possible to produce a nitride semiconductor laser device with less production steps than when a submount is used.

In the first and second embodiments, the n-electrode 3 of the nitride semiconductor laser chip 103 is formed by laying layers of Ti, Al, Mo, Pt, and Au in this order from the n-type GaN substrate 1 side so that these layers have thicknesses of 300 Å, 1,500 Å, 80 Å, 150 Å, and 1,500 Å, respectively. However, so long as the desired properties are obtained, any other structure may be formed using any other materials as the n-electrode 3. For example, the layers of Ti and Al for achieving ohmic contact with the n-type GaN substrate 1 may be replaced with layers of Hf and Au or the like.

The first and second embodiments described above deal with junction-up mounting in which the nitride semiconductor laser chip is mounted on the mount member so that the n-electrode formed on the bottom surface of the n-type GaN substrate is kept in contact with the mount member. By contrast, the third embodiment described below deals with junction-down mounting in which the nitride semiconductor laser chip is mounted on the mount member so that the p-electrode formed on the top surface of the layered nitride semiconductor portion is kept in contact with the mount member.

Third Embodiment

Figure 8:
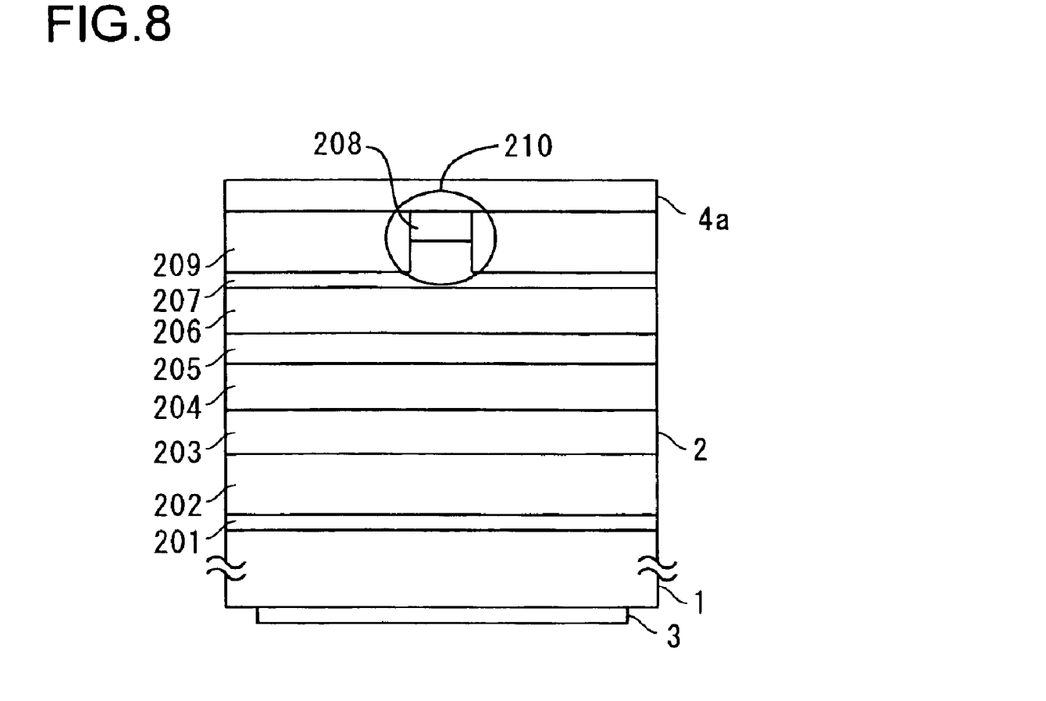
FIG. 8 is a sectional view showing the structure of a nitride semiconductor laser chip.
Figure 9:
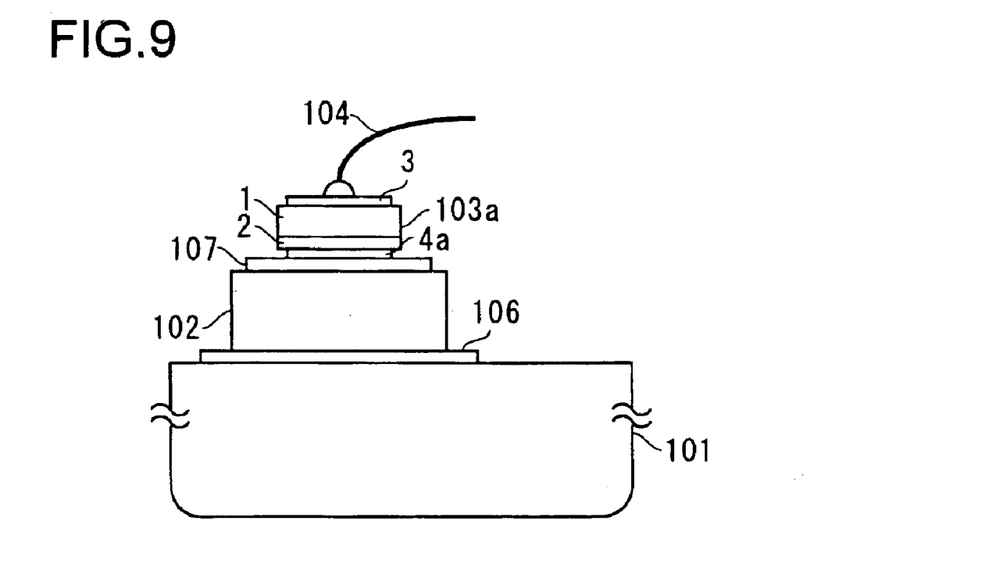
FIG. 9 is a sectional view showing the structure of the nitride semiconductor laser device of a third embodiment of the invention.

A third embodiment of the invention will be described below with reference to the drawings. FIG. 8 is a sectional view showing the structure of the nitride semiconductor laser chip employed in the nitride semiconductor laser device of this embodiment. FIG. 9 is a sectional view showing how the nitride semiconductor laser chip is mounted in the nitride semiconductor laser device of this embodiment. Here, as in the first embodiment, the nitride semiconductor laser chip is mounted as shown in FIG. 3 to produce the nitride semiconductor laser device. In this embodiment, a "submount" serves as a mount member. It is to be noted that, in FIGS. 8 and 9, such components as find their counterparts in FIGS. 1 and 2, respectively, are identified with the same reference numerals, and their detailed explanations will be omitted.

Like the nitride semiconductor laser chip shown in FIG. 1, the nitride semiconductor laser chip shown in FIG. 8 has, on the top surface of an n-type GaN substrate 1, an n-type AlGaInN buffer layer 201, an n-type AlGaInN contact layer 202, an n-type AlGaInN clad layer 203, an n-type AlGaInN guide layer 204, an n-type AlGaInN multiple quantum well active layer 205, a p-type AlGaInN guide layer 206, a p-type AlGaInN clad layer 207, and a p-type AlGaInN contact layer 208 laid in this order. Moreover, an insulating film 209 is laid on the surface of the p-type AlGaInN clad layer 207, along both sides of a ridge portion 210 formed by the p-type AlGaInN clad layer 207 and the p-type AlGaInN contact layer 208.

This nitride semiconductor laser chip has an n-electrode 3 formed on the bottom surface of the n-type GaN substrate 1, and has a p-electrode 4a formed on the surfaces of the p-type AlGaInN contact layer 208 and the insulating film 209. Here, as opposed to the p-electrode 4 shown in FIG. 1, which has its portion corresponding to the ridge portion 210 elevated, the p-electrode 4a is so formed as to be flat overall so that it can be kept in contact with the mount member. In the nitride semiconductor laser chip structured as described above, the layered nitride semiconductor portion 2 has a thickness of 10 µm.

The nitride semiconductor laser chip 103a structured as shown in FIG. 8 is fixed, with solder 107, to the submount 102 as in the first embodiment (FIG. 2) but, here, in a junction-down fashion as shown in FIG. 9. Thus, in this embodiment, as opposed to the first embodiment, the nitride semiconductor laser chip 103a is mounted, at its p-electrode 4a side, on the submount 102. Moreover, a wire 104 connected to a pin 105b as shown in FIG. 3 is connected to the n-electrode 3 of the nitride semiconductor laser chip 103a, so that the pin 105b is electrically connected to the n-electrode 3 of the nitride semiconductor laser chip 103a In the nitride semiconductor laser device of this embodiment structured as described above, the layered nitride semiconductor structure, composed of the n-type GaN substrate 1 and the layered nitride semiconductor portion 2 of the nitride semiconductor laser chip 103a, has a thickness of 200 µm. Here, the p-electrode 4a of the nitride semiconductor laser chip 103a is formed by laying layers of Pd, Mo, Au, Pt, and Au in this order by vacuum evaporation so that the layers of Pd, Mo, Au, Pt, and Au have thicknesses of 150 Å, 150 Å, 2,000 Å, 150 Å, and 1,500 Å, respectively.

The submount 102 is made of Cu, which has a thermal expansion coefficient higher than that of the n-type GaN substrate 1, and, on both the top and bottom surfaces of the submount 102, Mo and Au are formed by vacuum evaporation in this order to form layers of Mo and Au having thicknesses of 0.4 μm and 0.03 μm, respectively. The submount 102 as a whole has a thickness of 400 μm. On the surface of the submount 102, a metal layer including the solder 107 made of AuSn and laid between the layered nitride semiconductor portion 2 and the submount 102 is formed so as to have a thickness of 1.5 μm. With this solder 107, the nitride semiconductor laser chip 103a is bonded on the surface of the submount 102. The submount 102 having the nitride semiconductor laser chip 103a mounted on it is then fixed, with solder 106 made of ZnSn, on the surface of the chip mount portion 101.

With the nitride semiconductor laser device structured as described above, the laser operating lifetime is over 3,000 hours. In this way, not only in a case where a nitride semiconductor laser chip is mounted in a junction-up fashion, but also in a case where it is mounted in a junction-down fashion, it is possible to extend the laser operating lifetime. In particular in a case where a nitride semiconductor laser chip is mounted in a junction-down fashion as in this embodiment, as compared with a case where it is mounted in a junction-up fashion, it is possible to transmit stress to the light-emitting region more efficiently, and also to dissipate the heat generated in the light-emitting region to the mount member more efficiently. This helps further extend the laser operating lifetime.

In this embodiment, the submount 102 is structured as described above. However, the submount 102 may be structured in any other manner so long as, as in the first embodiment, its thermal expansion coefficient is higher than that of GaN used in the nitride semiconductor substrate (in this embodiment, the n-type GaN substrate 1), which is the main component of the layered nitride semiconductor structure, and its thickness is equal to or greater than 1.2 times the thickness of the layered nitride semiconductor structure of the nitride semiconductor laser chip. The solder 106 and 107 may be made of any other materials than specifically mentioned above so long as they meet requirements similar to those set out in the first embodiment.

In this embodiment, since the nitride semiconductor laser chip 103a is bonded to the mount member in a junction-down fashion, if the solder 107 is too thick, it may make contact with the pn-junction part of the nitride semiconductor laser chip 103a, making the produced semiconductor device inoperative. For this reason, here, as opposed to the first embodiment, the metal layer, including the solder 107, between the n-type GaN substrate 1 and the submount 102 needs to be given a thickness of from 1 to 10 μm to prevent the solder from making contact with the pn-junction part.

In this embodiment, a submount is used as a mount member. However, it is also possible, as in the second embodiment, to use a chip mount portion as a mount member and mount the nitride semiconductor laser chip directly on it. In that case, the chip mount portion and the solder used to mount the nitride semiconductor laser chip on it need to meet requirements similar to those imposed on the submount and the solder used to mount the nitride semiconductor laser chip on it.

According to the present invention, the mount member is given a thickness equal to or greater than 1.2 times the thickness of the layered nitride semiconductor structure, and the mount member is made of a material having a thermal expansion coefficient higher than that of the nitride semiconductor substrate, which is the main component of the layered nitride semiconductor structure. This is considered to permit the nitride semiconductor laser chip to be subjected to compressive stress, which extends the laser operating lifetime of the nitride semiconductor laser chip.

TABLE 1

| MATERIAL | THERMAL EXPANSION COEFFICIENT ($10^{-6}$ [1/K]) |
|---|---|
| Al | 23.7 |
| Ag | 19.3 |
| Cu | 17 |
| Au | 14.2 |
| Fe | 13.8 |
| Al—SiC | 8–12 |
| CuW20 | 8.3 |
| BeO | 7.6 |
| CuW15 | 7.2 |
| $Al_2O_3$ | 6.7 |
| CuW10 | 6.5 |
| GaAs | 5.9 |
| GaN | 5.6 |
| SiC | 3.7 |

What is claimed is:

1. A nitride semiconductor laser device comprising:
   a nitride semiconductor laser chip composed of a nitride semiconductor substrate, a layered nitride semiconductor portion having a plurality of nitride semiconductor layers laid on a surface of the nitride semiconductor substrate, and electrodes; and
   a mount member to which the nitride semiconductor laser chip is fixed, the mount member being made of a material having a thermal expansion coefficient higher than a thermal expansion coefficient of the nitride semiconductor substrate, the mount member having a thickness equal to or greater than 1.2 times a thickness of a layered nitride semiconductor structure composed of the nitride semiconductor substrate and the layered nitride semiconductor portion.

2. A nitride semiconductor laser device as claimed in claim 1, wherein the nitride semiconductor laser chip is fixed to the mount member with a solder made of AuSn, AgSn, AuSi, AuGe, PbSn, InSn or AgCuSn or of a compound containing AuSn, AgSn, AuSi, AuGe, PbSn, InSn or AgCuSn.

3. A nitride semiconductor laser device as claimed in claim 2, further comprising a stem having a submount comprising the mount member and having a chip mount portion formed thereon to which the submount is fixed.

4. A nitride semiconductor laser device as claimed in claim 3, wherein the nitride semiconductor laser chip is fixed to the submount with a solder having a higher melting point than a solder with which the submount is fixed to the chip mount portion.

5. A nitride semiconductor laser device as claimed in claim 4, wherein the nitride semiconductor laser chip is, at a nitride semiconductor substrate side thereof, fixed to the mount member.

6. A nitride semiconductor laser device as claimed in claim 5, wherein a metal layer laid between the layered nitride semiconductor structure and the mount member has a thickness of from 1 μm to 50 μm.

7. A nitride semiconductor laser device as claimed in claim 4, wherein the nitride semiconductor laser chip is, at a layered nitride semiconductor portion side thereof, fixed to the mount member.

8. A nitride semiconductor laser device as claimed in claim 7, wherein a metal layer laid between the layered nitride semiconductor structure and the mount member has a thickness of from 1 μm to 10 μm.

9. A nitride semiconductor laser device as claimed in claim 3, wherein the nitride semiconductor laser chip is, at a nitride semiconductor substrate side thereof, fixed to the mount member.

10. A nitride semiconductor laser device as claimed in claim 9, wherein a metal layer laid between the layered nitride semiconductor structure and the mount member has a thickness of from 1 μm to 50 μm.

11. A nitride semiconductor laser device as claimed in claim 3, wherein the nitride semiconductor laser chip is, at a layered nitride semiconductor portion side thereof, fixed to the mount member.

12. A nitride semiconductor laser device as claimed in claim 11, wherein a metal layer laid between the layered nitride semiconductor structure and the mount member has a thickness of from 1 μm to 10 μm.

13. A nitride semiconductor laser device as claimed in claim 2, further comprising a stem having a chip mount portion formed thereon, the chip mount porting comprising the mount member.

14. A nitride semiconductor laser device as claimed in claim 13, wherein the nitride semiconductor laser chip is, at a nitride semiconductor substrate side thereof, fixed to the mount member.

15. A nitride semiconductor laser device as claimed in claim 14, wherein a metal layer laid between the layered nitride semiconductor structure and the mount member has a thickness of from 1 μm to 50 μm.

16. A nitride semiconductor laser device as claimed in claim 13, wherein the nitride semiconductor laser chip is, at a layered nitride semiconductor portion side thereof, fixed to the mount member.

17. A nitride semiconductor laser device as claimed in claim 16, wherein a metal layer laid between the layered nitride semiconductor structure and the mount member has a thickness of from 1 μm to 10 μm.

18. A nitride semiconductor laser device as claimed in claim 2, further comprising a stem having a chip mount portion formed thereon, the mount member being fixed as a submount to the chip mount portion.

19. A nitride semiconductor laser device as claimed in claim 18, wherein the nitride semiconductor laser chip is fixed to the submount with a solder having a higher melting point than a solder with which the submount is fixed to the chip mount portion.

20. A nitride semiconductor laser device as claimed in claim 19, wherein the nitride semiconductor laser chip is, at a nitride semiconductor substrate side thereof, fixed to the mount member.

21. A nitride semiconductor laser device as claimed in claim 20, wherein a metal layer laid between the layered nitride semiconductor structure and the mount member has a thickness of from 1 μm to 50 μm.

22. A nitride semiconductor laser device as claimed in claim 19, wherein the nitride semiconductor laser chip is, at a layered nitride semiconductor portion side thereof, fixed to the mount member.

23. A nitride semiconductor laser device as claimed in claim 22, wherein a metal layer laid between the layered nitride semiconductor structure and the mount member has a thickness of from 1 μm to 10 μm.

24. A nitride semiconductor laser device as claimed in claim 18, wherein the nitride semiconductor laser chip is, at a nitride semiconductor substrate side thereof, fixed to the mount member.

25. A nitride semiconductor laser device as claimed in claim 24, wherein a metal layer laid between the layered nitride semiconductor structure and the mount member has a thickness of from 1 μm to 50 μm.

26. A nitride semiconductor laser device as claimed in claim 18, wherein the nitride semiconductor laser chip is, at a layered nitride semiconductor portion side thereof, fixed to the mount member.

27. A nitride semiconductor laser device as claimed in claim 26, wherein a metal layer laid between the layered nitride semiconductor structure and the mount member has a thickness of from 1 μm to 10 μm.

28. A nitride semiconductor laser device as claimed in claim 2, further comprising a stem having the mount member formed thereon as a chip mount portion.

29. A nitride semiconductor laser device as claimed in claim 28, wherein the nitride semiconductor laser chip is, at a nitride semiconductor substrate side thereof, fixed to the mount member.

30. A nitride semiconductor laser device as claimed in claim 29, wherein a metal layer laid between the layered nitride semiconductor structure and the mount member has a thickness of from 1 μm to 50 μm.

31. A nitride semiconductor laser device as claimed in claim 28, wherein the nitride semiconductor laser chip is, at a layered nitride semiconductor portion side thereof, fixed to the mount member.

32. A nitride semiconductor laser device as claimed in claim 31, wherein a metal layer laid between the layered nitride semiconductor structure and the mount member has a thickness of from 1 μm to 10 μm.

33. A nitride semiconductor laser device as claimed in claim 1, wherein the nitride semiconductor laser chip is, at a nitride semiconductor substrate side thereof, fixed to the mount member.

34. A nitride semiconductor laser device as claimed in claim 33, wherein a metal layer laid between the layered nitride semiconductor structure and the mount member has a thickness of from 1 μm to 50 μm.

35. A nitride semiconductor laser device as claimed in claim 1, wherein the nitride semiconductor laser chip is, at a layered nitride semiconductor portion side thereof, fixed to the mount member.

36. A nitride semiconductor laser device as claimed in claim 35, wherein a metal layer laid between the layered nitride semiconductor structure and the mount member has a thickness of from 1 μm to 10 μm.

37. A nitride semiconductor laser device as claimed in claim 1, wherein the electrodes of the nitride semiconductor laser chip are formed on a top surface of the layered nitride semiconductor portion and on a bottom surface of the nitride semiconductor substrate.

38. A nitride semiconductor laser device as claimed in claim 1, wherein the mount member is made of Fe, Au, Cu, Ag, Al, Al—SiC, $CuW_{20}$, BeO, $CuW_{15}$, $Al_2O_3$, $CuW_{10}$ or GaAs.

39. A nitride semiconductor laser device as claimed in claim 1, wherein the mount member is made of Fe, Au, Cu, Ag or Al.

40. A nitride semiconductor laser device comprising:
a nitride semiconductor laser chip composed of a nitride semiconductor substrate made of GaN, a layered nitride semiconductor portion having a plurality of nitride semiconductor layers laid on a surface of the nitride semiconductor substrate, and electrodes; and a mount member to which the nitride semiconductor laser chip is fixed, the mount member being made of Cu or Fe having a thermal expansion coefficient higher than a thermal expansion coefficient of the nitride semiconductor substrate, the mount member having a thickness equal to or greater than 1.2 times a thickness of a layered nitride semiconductor structure composed of the nitride semiconductor substrate and the layered nitride semiconductor portion.

41. A nitride semiconductor laser device as claimed in claim 40, wherein the nitride semiconductor laser chip is fixed to the mount member with a solder made of a compound containing AuSn or AgCuSn.

* * * * *